(12) United States Patent
Ho et al.

(10) Patent No.: US 12,255,240 B2
(45) Date of Patent: *Mar. 18, 2025

(54) TOPOLOGY SELECTIVE AND SACRIFICIAL SILICON NITRIDE LAYER FOR GENERATING SPACERS FOR A SEMICONDUCTOR DEVICE DRAIN

(71) Applicant: Taiwan Semiconductor Manufacturing Company, Ltd., Hsinchu (TW)

(72) Inventors: Tzu-Yang Ho, Hsinchu (TW); Tsai-Jung Ho, Xihu Township (TW); Jr-Hung Li, Chupei (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,048

(22) Filed: Jun. 27, 2023

(65) Prior Publication Data

US 2023/0343842 A1 Oct. 26, 2023

Related U.S. Application Data

(63) Continuation of application No. 17/304,214, filed on Jun. 16, 2021, now Pat. No. 11,742,399.

(51) Int. Cl.
*H01L 21/02* (2006.01)
*H01L 21/311* (2006.01)
(Continued)

(52) U.S. Cl.
CPC .... *H01L 29/41775* (2013.01); *H01L 21/0217* (2013.01); *H01L 21/02274* (2013.01);
(Continued)

(58) Field of Classification Search
None
See application file for complete search history.

(56) References Cited

U.S. PATENT DOCUMENTS 10,134,859 B1 11/2018 Bi et al.
11,742,399 B2 * 8/2023 Ho .................... H01L 21/31144
438/631

(Continued)

FOREIGN PATENT DOCUMENTS

CN 112038400 A 12/2020
TW 202034405 A 9/2020

*Primary Examiner* — Asok K Sarkar
(74) *Attorney, Agent, or Firm* — Harrity & Harrity, LLP

(57) ABSTRACT

A method may include forming a first silicon nitride layer in an opening of the semiconductor device and on a top surface of the semiconductor device, wherein the semiconductor device includes an epitaxial source/drain and a metal gate. The method may include forming a second silicon nitride layer on the first silicon nitride layer, as a sacrificial layer, and removing the second silicon nitride layer from sidewalls of the first silicon nitride layer formed in the opening. The method may include removing the second silicon nitride layer and the first silicon nitride layer formed at a bottom of the opening, and depositing a metal layer in the opening to form a metal drain in the opening of the semiconductor device.

20 Claims, 13 Drawing Sheets

(51) Int. Cl.
*H01L 29/40* (2006.01)
*H01L 29/417* (2006.01)

(52) U.S. Cl.
CPC .... *H01L 21/0228* (2013.01); *H01L 21/31111* (2013.01); *H01L 29/401* (2013.01)

(56) References Cited

U.S. PATENT DOCUMENTS

| | | |
|---|---|---|
| 2018/0174904 A1 | 6/2018 | Hsieh et al. |
| 2019/0181223 A1 | 6/2019 | Tang |
| 2019/0334011 A1 | 10/2019 | Cheng et al. |
| 2020/0044074 A1 | 2/2020 | Liang et al. |
| 2020/0152739 A1 | 5/2020 | Yang et al. |
| 2020/0303261 A1 | 9/2020 | Shen et al. |
| 2021/0384306 A1 | 12/2021 | Xie et al. |
| 2021/0391432 A1 | 12/2021 | Yoo et al. |
| 2022/0068971 A1 | 3/2022 | Wang et al. |
| 2022/0238667 A1 | 7/2022 | Wang |
| 2022/0271131 A1 | 8/2022 | Wang et al. |
| 2022/0406910 A1 | 12/2022 | Ho et al. |

\* cited by examiner

Process conditions for topography selective silicon nitride layer deposition

| Step | | Main deposition | Post treatment |
|---|---|---|---|
| Cycle time | | 90 minutes | 30 minutes |
| Di-chlorosilane (DCS) 1 | Standard liters per minute (slm) | ~0.5 to ~1.5 | *** |
| DCS 2 | slm | ~0.5 to ~1.5 | *** |
| DCS purge Argon (Ar) | slm | ~1 to ~3 | *** |
| Ammonia (NH3) | slm | ~0.5 to ~1.5 | *** |
| NH3 purge Ar | slm | ~0.5 to ~1.5 | |
| Ar | slm | ~5 to ~7 | ~5 to ~7 |
| Nitrogen (N2) | slm | ~1 to ~2 | ~1 to ~2 |
| Carrier gas Ar | slm | ~5 to ~6 | ~5 to ~6 |
| Seal N2 | slm | ~3 to ~5 | ~3 to ~5 |
| Chamber pressure | mTorr | ~2500 to ~3500 | ~2500 to ~3500 |
| Heater (RF) | Watts (W) | ~130 to ~160 | ~130 to ~160 |
| Gap | Millimeters (mm) | ~11 to ~15 | ~11 to ~15 |
| Recipe shift (seconds) | DCS feed | ~0 to ~1 | |
| | DCS purge | ~0 to ~1 | |
| | NH3 feed | 0 | |
| | Heater on | ~1 to ~2 | |
| | NH3 purge | ~0 to ~0.4 | |
| | Post treatment purge | | ~0 to ~0.5 |
| | Post treatment on | | ~0 to ~0.5 |
| RF table | Number | ~1 to ~5 | ~2 to ~6 |

FIG. 3

TOPOLOGY SELECTIVE AND SACRIFICIAL SILICON NITRIDE LAYER FOR GENERATING SPACERS FOR A SEMICONDUCTOR DEVICE DRAIN

RELATED APPLICATION

This application is a continuation of U.S. patent application Ser. No. 17/304,214, filed Jun. 16, 2021, which is incorporated herein by reference in its entirety.

BACKGROUND

A logic device is an electronic device implementing a logical operation performed on one or more binary inputs that produces a single binary output. A logic device may include a multiplexer, a register, an arithmetic logic unit, a computer memory, a microprocessor, and/or the like. Some logic devices are made from metal-oxide-semiconductor field-effect transistors (MOSFETs). A static random-access memory (SRAM) is a type of semiconductor random-access memory device that uses bi-stable latching circuitry (e.g., a flip-flop) to store each bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I are diagrams of one or more example operations involved in manufacturing an example semiconductor device described herein.

FIG. 3 is a table of an example process conditions for depositing a topography selective silicon nitride layer for generating spacers for a metal drain of the example semiconductor device.

DETAILED DESCRIPTION

Figure 1:
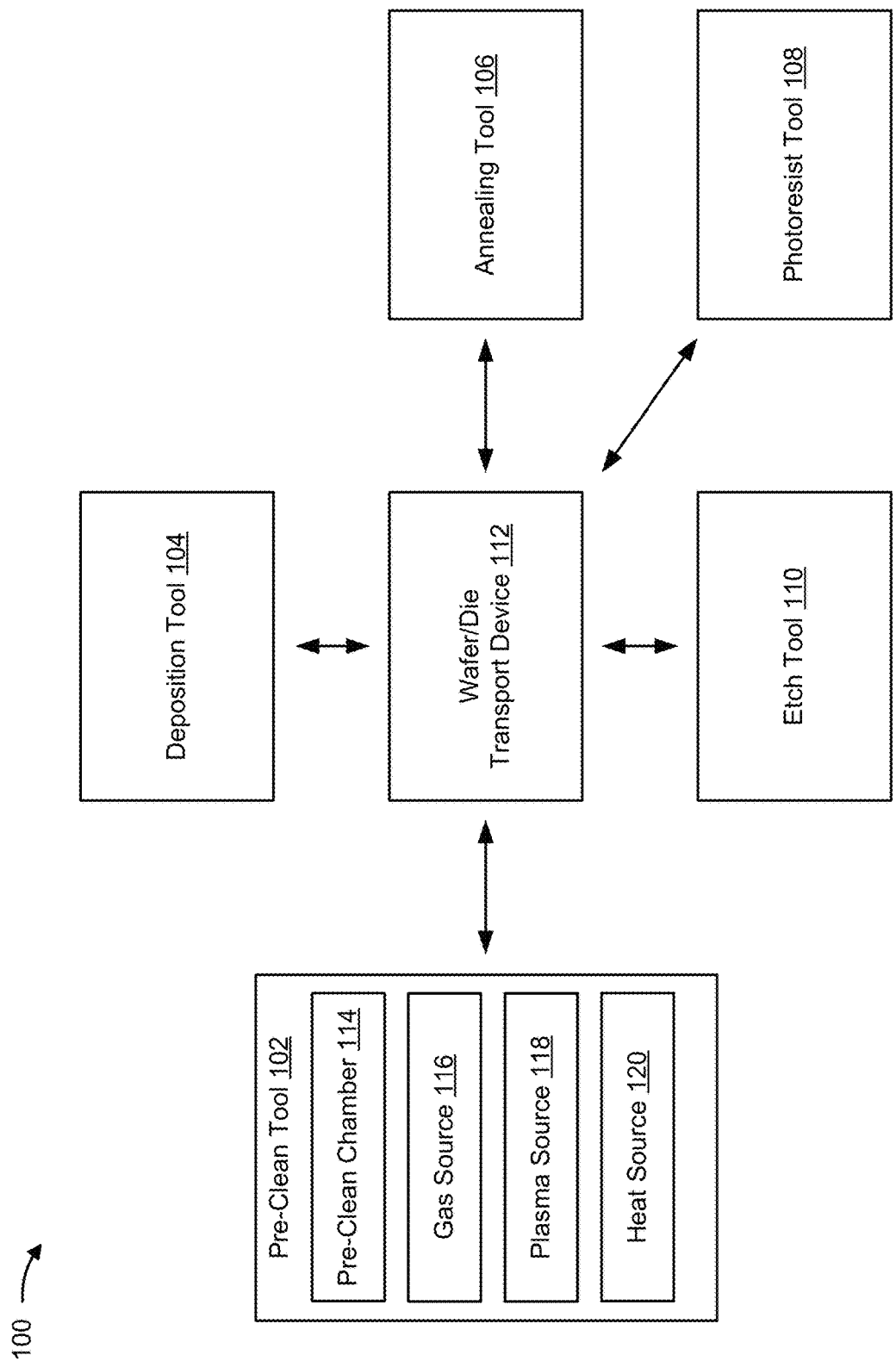
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device may include a field-effect transistor (FET). A FET is a type of transistor that uses an electric field to control a flow of current. A FET includes three terminals: an epitaxial source/drain, a metal gate, and a metal drain. A FET controls the flow of current by applying a voltage to the metal gate, which in turn alters a conductivity between the metal drain and the epitaxial source/drain. Spacers are provided between the metal drain and the metal gate to prevent leakage of current between the metal drain and the metal gate. However, prior manufacturing processes remove portions of the spacers during manufacture of a semiconductor device, such as a FET. The removal of the portions of the spacers reduces the effectiveness of the spacers at preventing leakage of current between the metal drain and the metal gate, which may result in an inoperable semiconductor device. Furthermore, the removal of the portions of the spacers increases a likelihood of defects forming in the semiconductor device, such as dark voltage contrast (DVC) defects, bright voltage contrast (BVC) defects, and/or the like.

According to some implementations described herein, a method for manufacturing a semiconductor device is based on depositing a topography selective silicon nitride layer for generating spacers for a metal drain of the semiconductor device. For example, the method may include forming a first silicon nitride layer in an opening of the semiconductor device and on a top surface of the semiconductor device, where the semiconductor device may include an epitaxial source/drain and a metal gate. The method may include forming a second silicon nitride layer on the first silicon nitride layer formed in the opening of the semiconductor device and on the top surface of the semiconductor device, where the second silicon nitride layer may be topography selective. The method may include removing the second silicon nitride layer from sidewalls of the first silicon nitride layer formed in the opening of the semiconductor device, and removing the second silicon nitride layer and the first silicon nitride layer formed at a bottom of the opening of the semiconductor device. The method may include removing the second silicon nitride layer and the first silicon nitride layer formed on the top surface of the semiconductor device, and forming a metal layer in the opening and on the top surface of the semiconductor device. The method may include removing the metal layer from the top surface of the semiconductor device to form a metal drain in the opening of the semiconductor device.

In this way, a method for manufacturing a semiconductor device is based on depositing a topography selective silicon nitride layer for generating spacers for a metal drain of the semiconductor device. The topography selective silicon nitride layer is a sacrificial layer that ensures that the spacers (e.g., formed from silicon nitride) include a thickness that prevents and/or reduces defects in the semiconductor device, prevents and/or reduces leakage from the metal drain to the metal gate, and/or the like. For example, the sacrificial topography selective silicon nitride layer decreases a likelihood of DVC defects, BVC defects, and/or the like forming in the semiconductor device. The topography selective silicon nitride layer may also prevent etching loss of the first silicon nitride layer from the sidewalls of the opening prior to formation of the metal drain.

FIG. 1 is a diagram of an example environment 100 in which systems and/or methods described herein may be implemented. As shown in FIG. 1, environment 100 may include a pre-clean tool 102, a deposition tool 104, an annealing tool 106, a photoresist tool 108, an etch tool 110, and a wafer/die transport device 112. The tools and/or devices included in example environment 100 may be included in a semiconductor clean room, a semiconductor foundry, a semiconductor processing and/or manufacturing facility, and/or the like.

Pre-clean tool 102 includes a pre-clean chamber 114 and one or more devices capable of performing a pre-clean process on a semiconductor device to remove a byproduct layer from the semiconductor device. The one or more devices may include a gas source 116, a plasma source 118, a heat source 120, and/or the like. Gas source 116 may supply various gasses to pre-clean chamber 114, such as an ammonia gas, a nitrogen trifluoride gas, and/or the like. Plasma source 118 may generate a plasma that causes a reaction between the gasses supplied to pre-clean chamber 114. For example, plasma source 118 may include an inductively coupled plasma (ICP) source, transformer coupled plasma (TCP) source, or another type of plasma source capable of causing a reaction between an ammonia gas and a nitrogen trifluoride gas to cause the formation of an ammonium fluoride gas. Heat source 120 may be capable of heating a semiconductor device in pre-clean chamber 114 to cause one or more layers on the semiconductor device to decompose, as described herein. For example, heat source 120 may include a heat lamp, a heating coil, or another type of heating device that heats the semiconductor device to cause an ammonium fluoride layer on the semiconductor device to decompose into an ammonia gas and a hydrogen fluoride gas, as described herein.

Deposition tool 104 is a semiconductor processing tool that includes a semiconductor processing chamber and one or more devices capable of depositing various types of materials onto a semiconductor device. For example, deposition tool 104 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), an ion implantation device, and/or the like. In some implementations, deposition tool 104 may deposit a metal layer onto a source region or a drain region of a semiconductor device, may deposit a contact material to form a contact of a semiconductor device, and/or the like as described herein.

Annealing tool 106 is a semiconductor processing tool that includes a semiconductor processing chamber and one or more devices capable of heating a semiconductor device. For example, annealing tool 106 may include a rapid thermal annealing (RTA) tool or another type of annealing tool that is capable of heating a semiconductor device to cause a reaction between two or more materials or gasses, to cause a material to decompose, and/or the like. For example, annealing tool 106 may heat a semiconductor device to cause a metal layer on an epitaxial region (e.g., a source region or a drain region) to react and form a metal silicide layer, as described herein.

Photoresist tool 108 is a semiconductor processing tool that removes materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. Photoresist tool 108 may coat the semiconductor device with a photo-sensitive organic material, and may apply a patterned mask to the semiconductor device to block light, so that only unmasked regions of the photo-sensitive organic material will be exposed to light. Photoresist tool 108 or another tool (e.g., etch tool 110) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed.

Etch tool 110 is a semiconductor processing tool that removes materials from a surface of a semiconductor device. In some implementations, a portion of the semiconductor device is protected from an etchant by a masking material that resists etching. For example, the masking material may include a photoresist that is patterned using photolithography. Etch tool 110 may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.01 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetrafluoride may be utilized to etch silicon and chlorine may be utilized to etch aluminum, trifluoromethane may be used to etch silicon dioxide and silicon nitride, and/or the like. The plasma may also include oxygen that is used to oxidize photoresist and facilitate removal of the photoresist.

Wafer/die transport device 112 includes a mobile robot, a robot arm, a tram or rail car, and/or another type of device that are used to transport wafers and/or dies between semiconductor processing tools 102-110 and/or to and from other locations, such as a wafer rack, a storage room, and/or the like. In some implementations, wafer/die transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
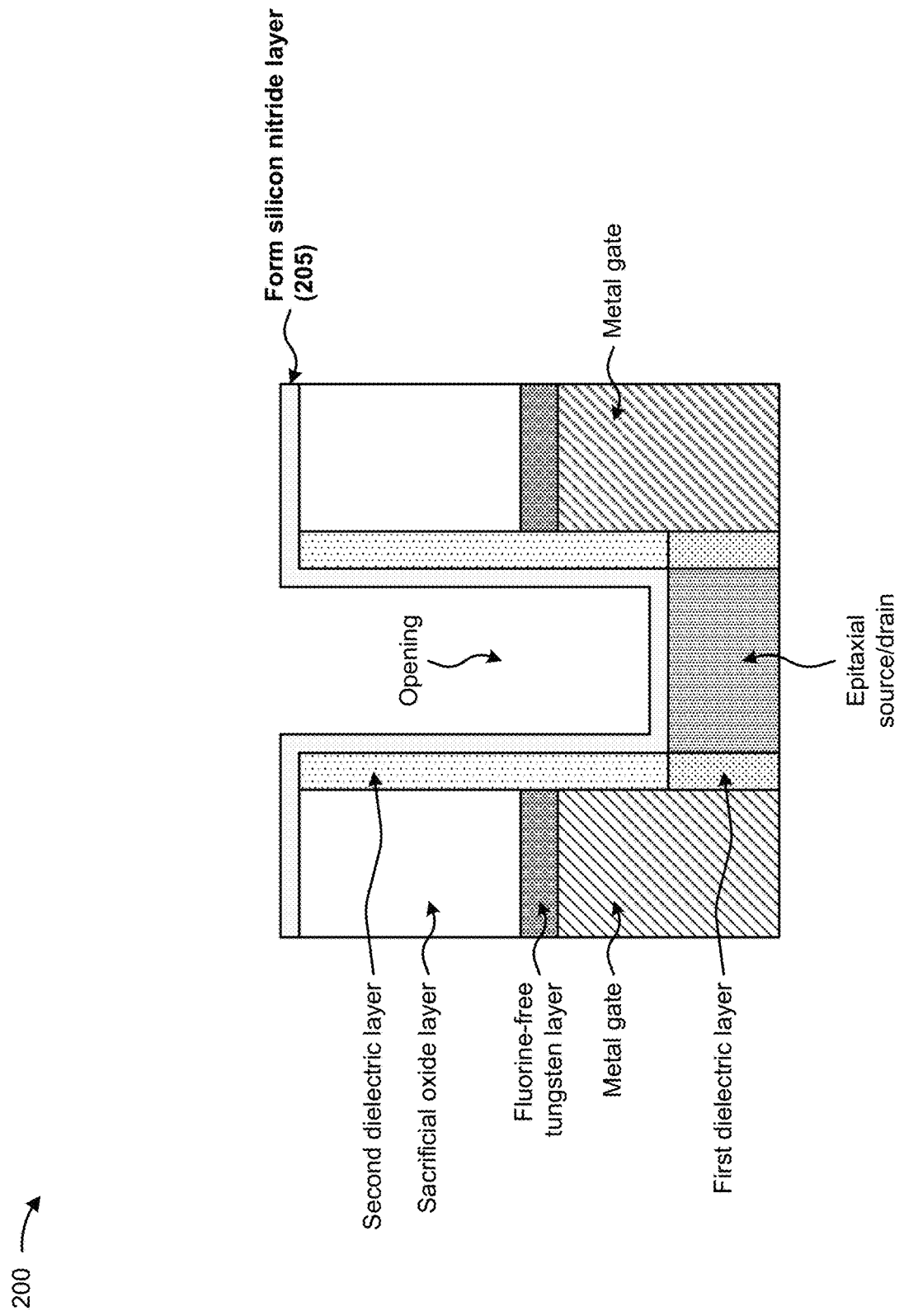

FIGS. 2A-2I are diagrams of one or more example operations 200 involved in manufacturing an example semiconductor device described herein (e.g., a logic device, a memory device, a finFET, a MOSFET, and/or the like). As shown in FIG. 2A, the semiconductor device may include an epitaxial source/drain, a first dielectric layer formed adjacent to the epitaxial source/drain, metal gates formed on both sides of the epitaxial source/drain, a fluorine-free tungsten layer formed on the metal gates, a sacrificial oxide layer formed on the fluorine-free tungsten layer, and a second dielectric layer formed adjacent to the sacrificial oxide layer, the fluorine-free tungsten layer, and portions of the metal gates. As further shown, an opening may be formed above the epitaxial source/drain.

The epitaxial source/drain may include a silicon germanium layer formed via epitaxial growth. In some implementations, the epitaxial source/drain forms a source/drain plug that is electrically coupled to one or more other components of the semiconductor device. The first dielectric layer formed adjacent to the epitaxial source/drain may include a material that electrically insulates the epitaxial source/drain from other components of the semiconductor device (e.g., the metal gates). For example, the material may include silicon, silicon nitride, silicon oxide, a low-K dielectric material (e.g., fluorine-doped silicon dioxide, an organo-silicate glass, a porous silicon dioxide, a spin-on organic polymeric dielectric, and/or the like), and/or the like.

The metal gates may include a conductive metal, such as titanium, cobalt, tungsten, aluminum, copper, ruthenium, iridium, and/or the like. The fluorine-free tungsten layer may include a layer of a material (e.g., fluorine-free tungsten) that provides electrical connectivity between the metal gates and metal contacts of the semiconductor device (e.g., as shown in FIG. 2I). The sacrificial oxide layer may include a layer (e.g., silicon oxide, iron oxide, aluminum oxide, and/or the like) that is eventually removed and replaced with a component of the semiconductor device (e.g., a metal contact). The second dielectric layer formed adjacent to the sacrificial oxide layer, the fluorine-free tungsten layer, and portions of the metal gates may include a material (e.g., silicon, silicon nitride, silicon oxide, and/or the like) that electrically insulates the metal gates from other components of the semiconductor device.

As further shown in FIG. 2A, and by reference number 205, a silicon nitride layer (e.g., a first silicon nitride layer) may be formed in the opening and on a top surface of the semiconductor device. In some implementations, the silicon nitride layer includes a thickness that prevents and/or reduces defects in the semiconductor device, prevents and/or reduces current leakage between the metal gate and a metal drain to be formed in the opening of the semiconductor device, and/or the like. For example, the silicon nitride layer may include a thickness in a range from approximately 0.8 nanometers to approximately 3.0 nanometers, although other thickness ranges are possible, such as 1.0 nanometer to 2.5 nanometers, or 2.1 nanometers to 2.5 nanometers. For example, the silicon nitride layer may include a thickness of approximately 2.1 nanometers at the sidewall, a thickness of approximately 2.5 nanometers at a bottom of the opening, a thickness of approximately 2.5 nanometers at the top surface of the semiconductor device, and/or the like. In some implementations, deposition tool 104 of environment 100, described above in connection with FIG. 1, may be utilized to form the silicon nitride layer in the opening and on the top surface of the semiconductor device.

Figure 2B:
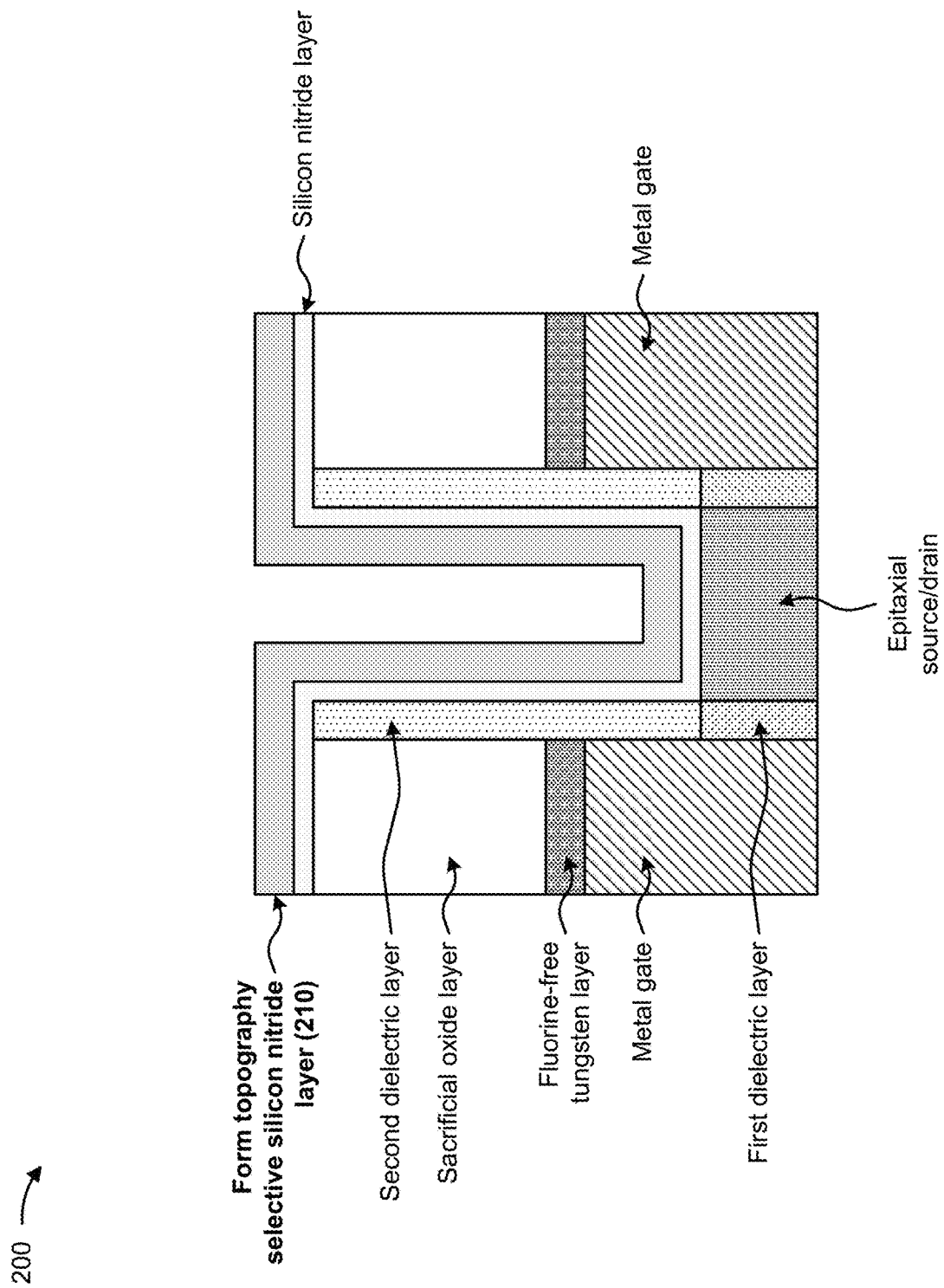

As shown in FIG. 2B, and by reference number 210, a plasma enhanced atomic layer deposition operation may be performed to form a topography selective silicon nitride layer (e.g., a second silicon nitride layer) on the silicon nitride layer (e.g., the first silicon nitride layer) formed in the opening and on the top surface of the semiconductor device. In some implementations, the topography selective silicon nitride layer includes a thickness that prevents and/or reduces defects in the semiconductor device, prevents and/or reduces current leakage between the metal gate and the metal drain to be formed in the opening of the semiconductor device, and/or the like. For example, the topography selective silicon nitride layer may include a thickness in a range from approximately 2.5 nanometers to approximately 4.5 nanometers, although other thickness ranges are possible. The thicknesses of the topography selective silicon nitride layer at sidewall and at bottom are substantially the same. A ratio of thickness of selective silicon nitride layer at sidewall to thickness of selective silicon nitride layer at bottom is about from approximately 0.9 to approximately 1.1. In some implementations, the silicon nitride layer and the topography selective silicon nitride layer together include a thickness that prevents and/or reduces defects in the semiconductor device, prevents and/or reduces current leakage between the metal gate and the metal drain to be formed in the opening of the semiconductor device, and/or the like. In some implementations, the topography selective silicon nitride layer is a sacrificial layer that is to be removed during subsequent processing of the semiconductor device.

The topography selective silicon nitride layer may be "topography selective" since a portion of the topography selective silicon nitride layer formed on a bottom of the opening of the semiconductor device may be denser than a portion of the topography selective silicon nitride layer formed on sidewalls of the opening. Additionally, or alternatively, a portion of the topography selective silicon nitride layer formed on the top surface of the semiconductor device may be denser than the portion of the topography selective silicon nitride layer formed on the sidewalls of the opening.

In some implementations, deposition tool 104 of environment 100, described above in connection with FIG. 1, may be utilized to form the topography selective silicon nitride layer on the silicon nitride layer formed in the opening and on the top surface of the semiconductor device. For example, deposition tool 104 may perform the plasma enhanced atomic layer deposition operation to form the topography selective silicon nitride layer on the silicon nitride layer formed in the opening and on the top surface of the semiconductor device. In some implementations, the plasma enhanced atomic layer deposition operation may be performed under particular process conditions to form the topography selective silicon nitride layer. For example, the plasma enhanced atomic layer deposition operation may include a deposition operation performed with di-chlorosilane and ammonia, with a particular heater power (e.g., approximately one-hundred and forty-five Watts, at least one-hundred and forty-five Watts, and/or the like), at a particular temperature (e.g., approximately four-hundred and fifty degrees Celsius, at least four-hundred and fifty degrees Celsius, and/or the like), and for a particular time period (e.g., approximately 1.5 seconds, less than 1.5 seconds, and/or the like), to form the topography selective silicon nitride layer, although other process conditions are possible. In some implementations, the deposition operation may be performed a particular quantity of times (e.g., three times) followed by a treatment operation (e.g., with argon and nitrogen gases at approximately four-hundred and fifty degrees Celsius). Further details of the particular process conditions for forming the topography selective silicon nitride layer are provided below in connection with FIG. 3.

Figure 2C:
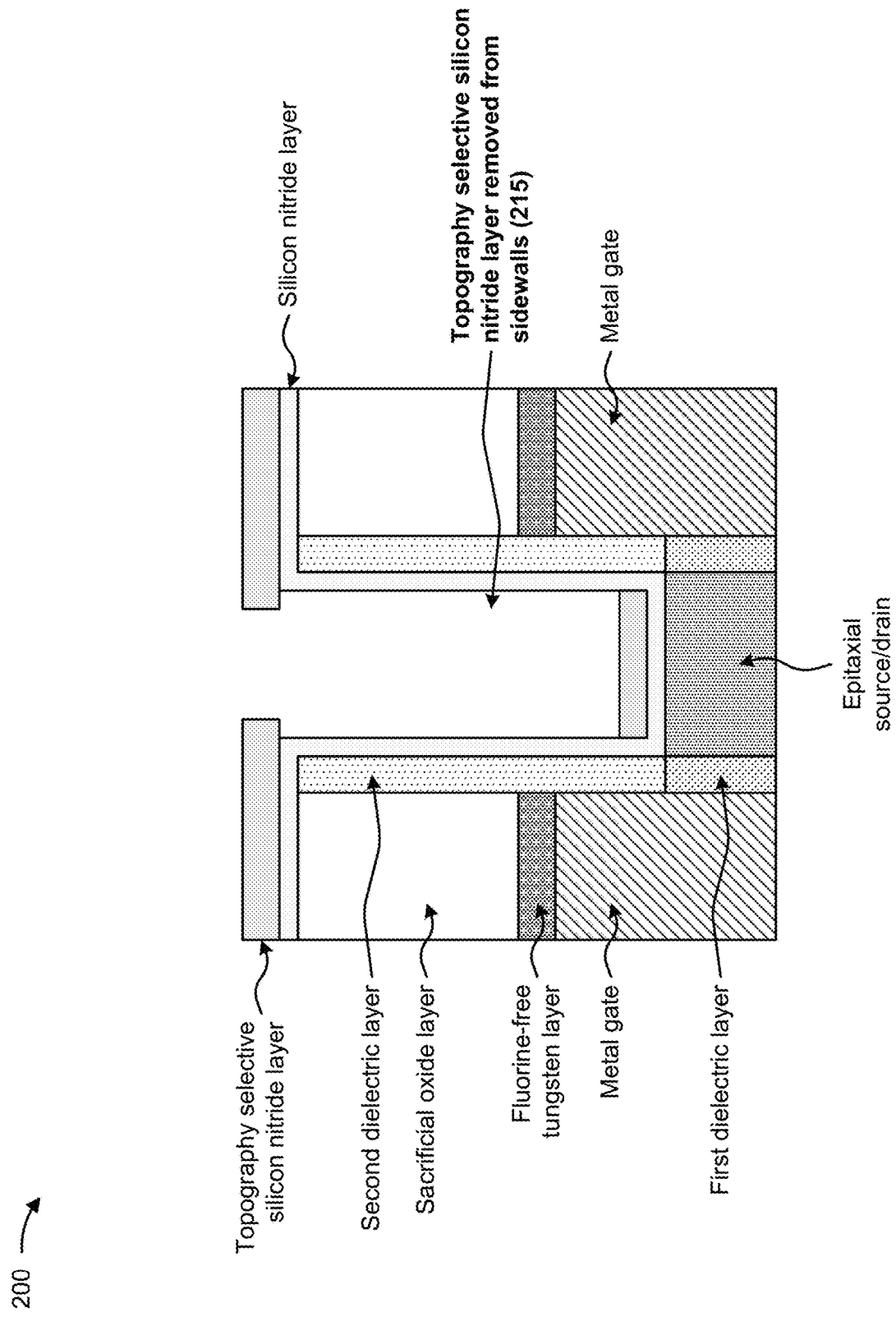

As shown in FIG. 2C, and by reference number 215, an etching operation may be performed to remove the topography selective silicon nitride layer from the sidewalls of the silicon nitride layer formed in the opening of the semiconductor device. In some implementations, the topography selective silicon nitride layer (e.g., the second silicon nitride layer) is removed from the sidewalls of the silicon nitride layer (e.g., the first silicon nitride layer) formed in the opening of the semiconductor device, without removing the silicon nitride layer (e.g., the first silicon nitride layer) formed on the sidewalls of the opening (e.g., without reducing a thickness of the silicon nitride layer formed on the sidewalls). In some implementations, etch tool 110 of environment 100, described above in connection with FIG. 1, may be utilized to remove the topography selective silicon nitride layer from the sidewalls of the silicon nitride layer formed in the opening of the semiconductor device. In some implementations, the etching operation may be performed under particular process conditions to remove the topography selective silicon nitride layer from the sidewalls of the silicon nitride layer formed in the opening of the semiconductor device. For example, the etching operation may be performed for a particular time period (e.g., approximately sixty seconds, less than sixty seconds, and/or the like) and with a hydrofluoric acid diluted with water in a particular ratio (e.g., approximately 500:1, less than 500:1, and/or the like), to remove the topography selective silicon nitride layer from the sidewalls of the silicon nitride layer formed in the opening of the semiconductor device (e.g., without reducing a thickness of the silicon nitride layer formed on the sidewalls), although other process conditions are possible. After this wet etch, the silicon nitride layer and the topography selective silicon nitride layer together include a thickness of no more than 5 nm at the bottom of the opening, and a thickness of more than 7 nm at the top of the sacrificial oxide layer.

Figure 2D:
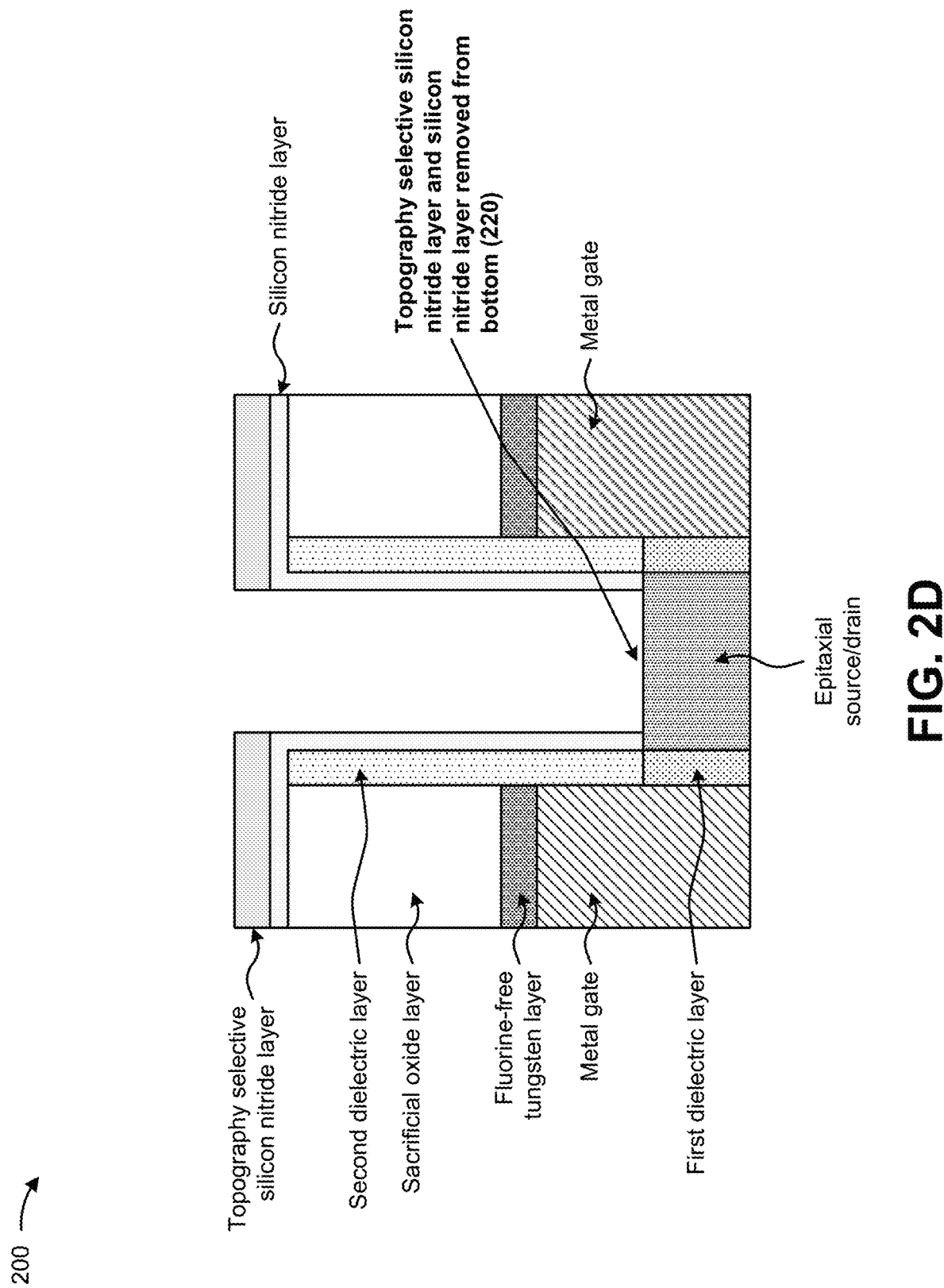

As shown in FIG. 2D, and by reference number 220, an etching operation may be performed to remove the topography selective silicon nitride layer and the silicon nitride layer formed at a bottom of the opening of the semiconductor device. In some implementations, the topography selective silicon nitride layer and the silicon nitride layer formed at the bottom of the opening of the semiconductor device is removed. In some implementations, the epitaxial source/drain is exposed without removing the silicon nitride layer formed on the sidewalls of the opening (e.g., without reducing a thickness of the silicon nitride layer formed on the sidewalls) and without removing the topography selective silicon nitride layer and the silicon nitride layer formed on the top surface of the semiconductor device. In some implementations, a thickness of the silicon nitride layer formed on the sidewalls and a thickness of the topography selective silicon nitride layer formed on the top surface of the semiconductor device are reduced. For example, the thickness of the silicon nitride layer and the topography selective silicon nitride layer together at the top of the sacrificial oxide layer may be reduced to 5.5 nm, and the thickness of the topography selective silicon nitride layer on the sidewalls may be reduced to 1.5 nm. In some implementations, etch tool 110 of environment 100, described above in connection with FIG. 1, and a mask (e.g., to mask the top surface) may be utilized to remove the topography selective silicon nitride layer and the silicon nitride layer formed at the bottom of the opening of the semiconductor device. Removal of the topography selective silicon nitride layer and the silicon nitride layer formed at the bottom of the opening of the semiconductor device may expose a top surface of the epitaxial source/drain, as further shown in FIG. 2D.

Figure 2E:
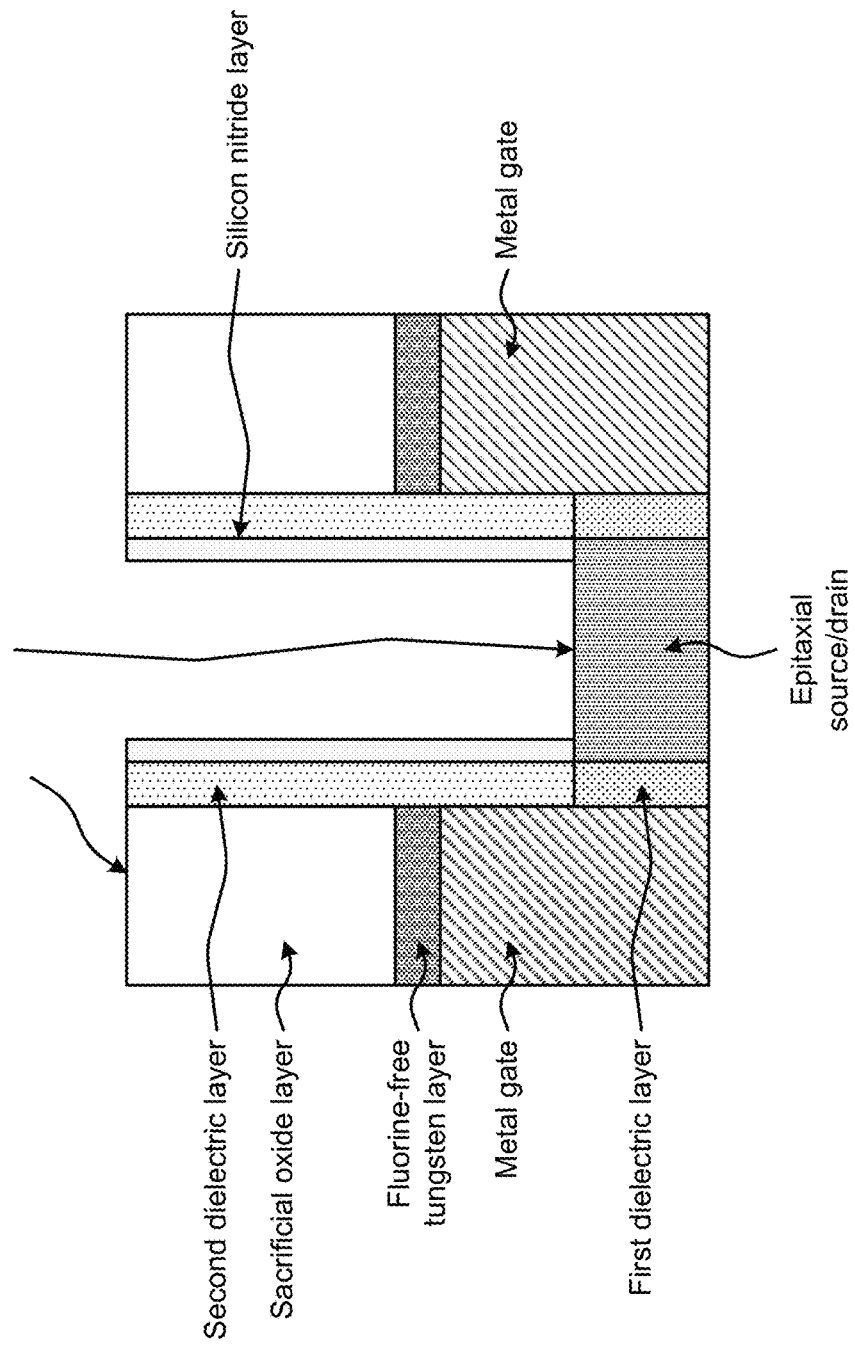

As shown in FIG. 2E, and by reference number 225, a pre-cleaning operation may be performed to remove native oxides formed on the exposed top surface of the epitaxial source/drain. In some implementations, the topography selective silicon nitride layer and the silicon nitride layer formed at the top surface of the semiconductor device may be removed without removing the silicon nitride layer formed on the sidewalls of the opening (e.g., without reducing a thickness of the silicon nitride layer formed on the sidewalls). In some implementations, pre-clean tool 102 of environment 100, described above in connection with FIG. 1, may be utilized to remove any native oxides formed on the exposed top surface of the epitaxial source/drain (at the bottom of the opening). An example pre-clean tool 102 may include a Collins pre-clean tool. A Collins pre-clean tool may be used to selectively remove native deep bottom oxide layers from the semiconductor device (e.g., to minimize loss of silicon and nickel) using a reaction gas that includes a combination of nitrogen trifluoride and ammonia.

Figure 2F:
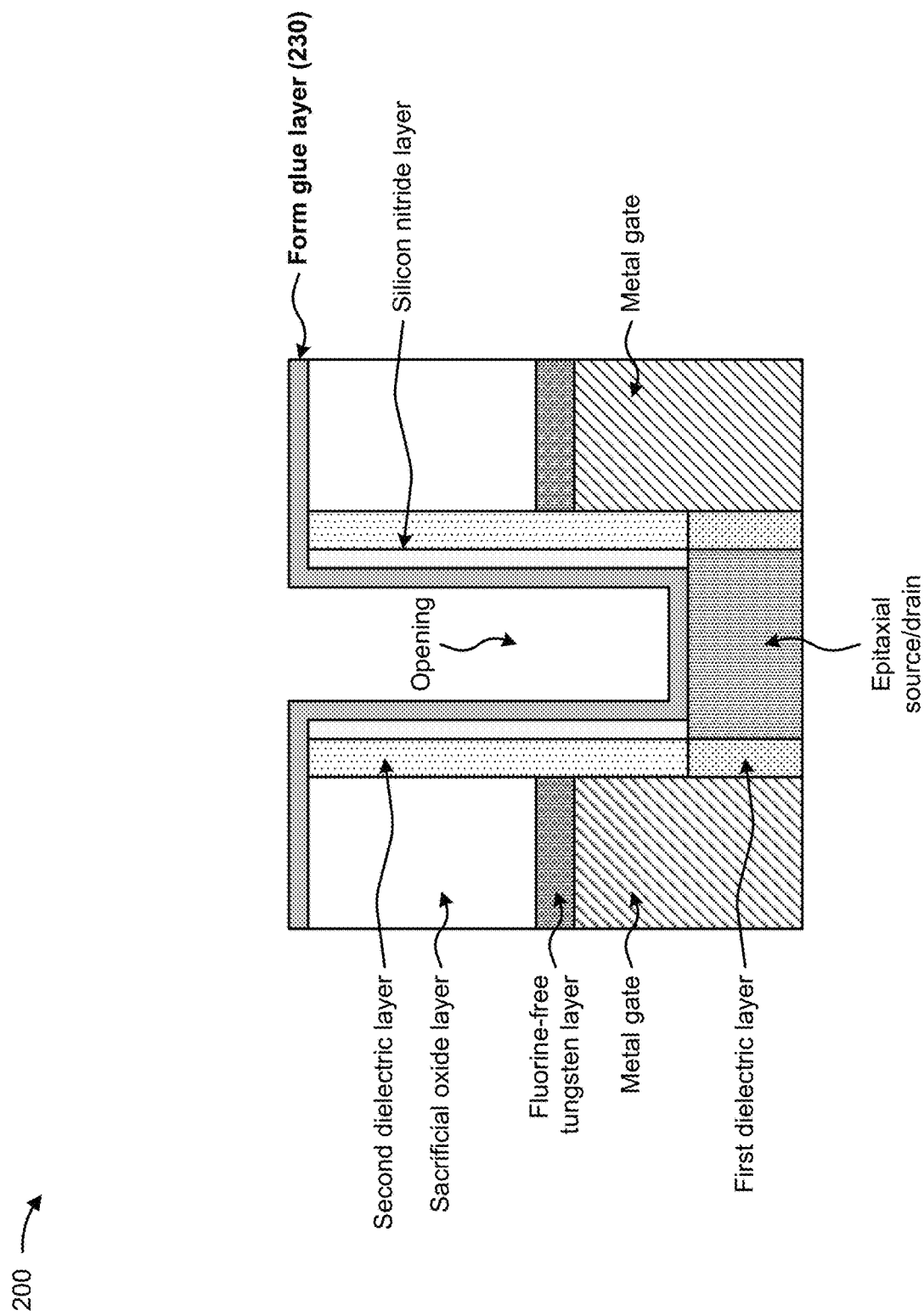

As shown in FIG. 2F, and by reference number 230, a deposition operation may be performed to form a glue layer in the opening and on the top surface of the semiconductor device. For example, the glue layer may be deposited on a portion of the sacrificial oxide layer, the second dielectric layer, the silicon nitride layer, and the epitaxial source/drain. In some implementations, the glue layer includes a material (e.g., titanium silicon) that improves deposition of a subsequent metal layer in the opening of the semiconductor device. In some implementations, deposition tool 104 of environment 100, described above in connection with FIG. 1, may be utilized to form the glue layer on top of the sacrificial oxide layer, the second dielectric layer, the silicon nitride layer, and the epitaxial source/drain.

Figure 2G:
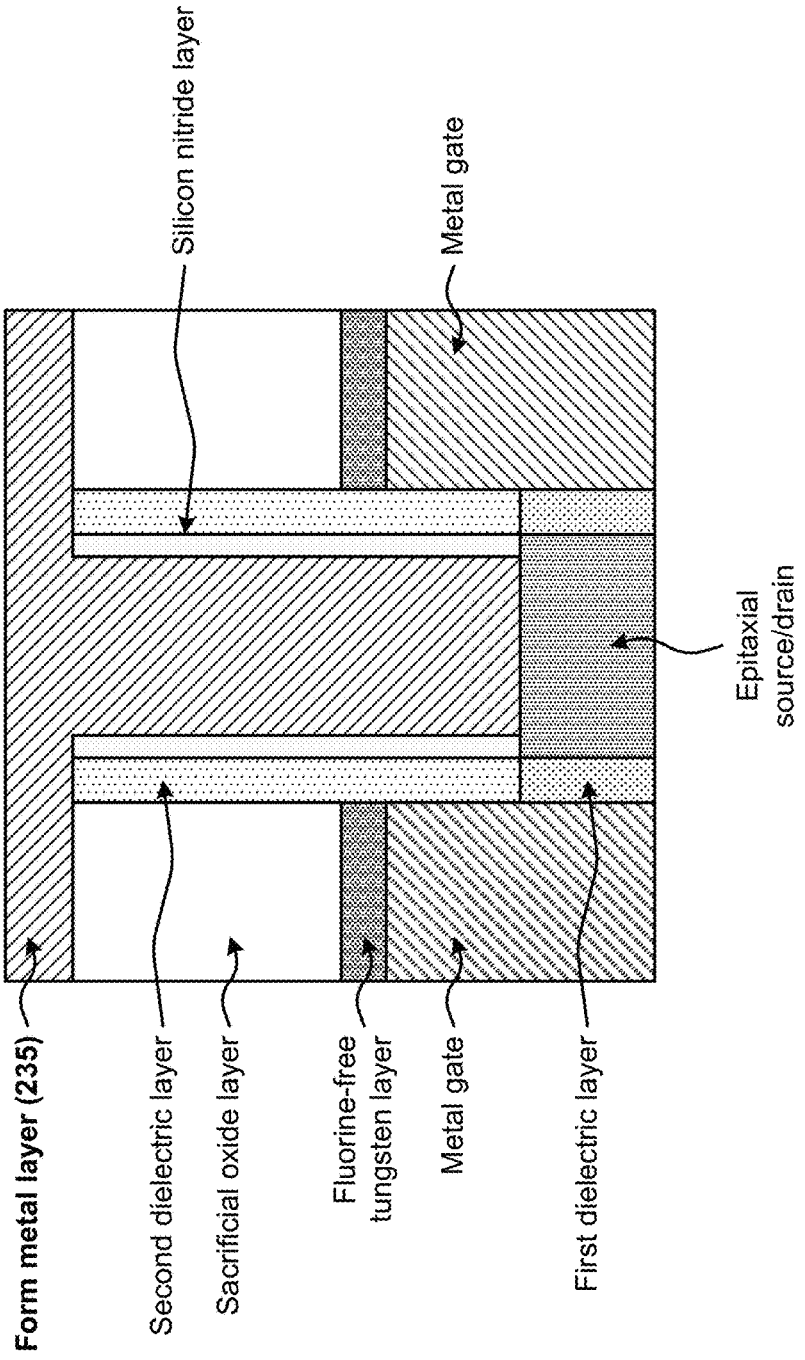

As shown in FIG. 2G, and by reference number 235, a deposition operation may be performed to form a metal layer via the glue layer and in the opening of the semiconductor device. In some implementations, the deposition operation may be performed to form the metal layer via the glue layer and in the opening and at least partially on the top surface of the semiconductor device. The metal layer may include a conductive metal, such as titanium, cobalt, tungsten, aluminum, copper, ruthenium, iridium, and/or the like. In some implementations, the metal layer may be formed within the opening and on the top surface of the semiconductor device, may be formed on top of the glue layer, may merge with the glue layer, and/or the like. In some implementations, deposition tool 104 of environment 100, described above in connection with FIG. 1, may be utilized to perform the deposition operation that forms the metal layer via the glue layer and in the opening of the semiconductor device.

Figure 2H:
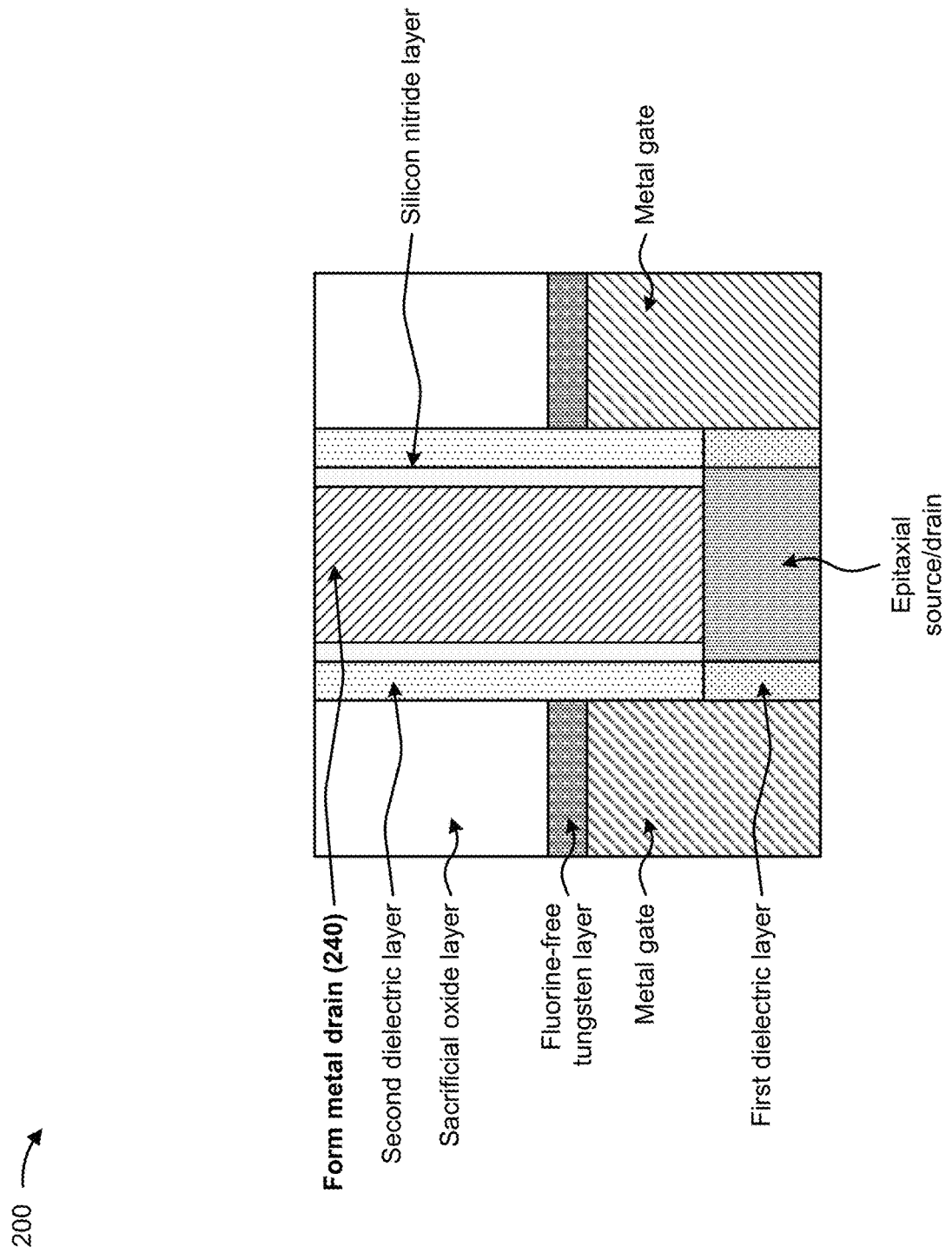
Figure 21:
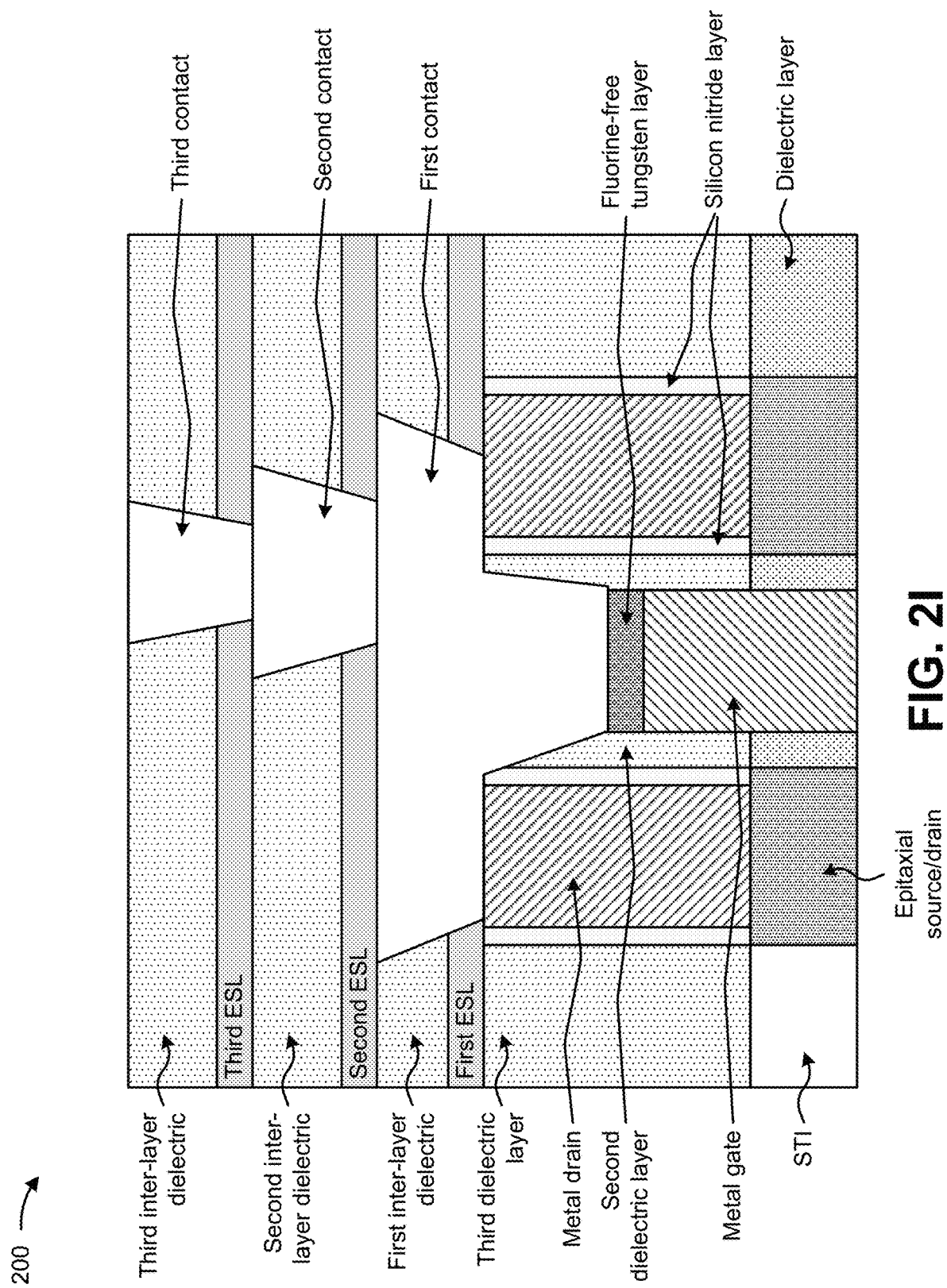

As shown in FIG. 2H, and by reference number 240, a polishing operation may be performed to form a metal drain for the semiconductor device from the metal layer (e.g., to remove the metal layer formed partially on the top surface of the semiconductor device and to planarize the metal layer with the top surface). In some implementations, the metal drain contacts the top surface of the epitaxial source/drain and the silicon nitride layer provided on both sides of the metal drain form silicon nitride spacers for the metal drain. Each of the silicon nitride spacers may include a particular thickness range (e.g., from approximately 1.5 nm to approximately 2.1 nm) to reduce defects in the semiconductor device and to prevent leakage from the metal drain to the metal gate. In some implementations, a chemical-mechanical polishing tool or etch tool 110 of environment 100, described above in connection with FIG. 1, may be utilized to perform the polishing operation that forms the metal drain for the semiconductor device from the metal layer.

As shown in FIG. 2I, one or more additional operations may be performed to complete the semiconductor device. For example, a first etch stop layer (ESL) may be formed completely or partially on one or more or the second dielectric layer, the metal gate, the first silicon nitride layer, and the metal drain. The first ESL may include a material, such as silicon nitride, silicon oxynitride, silicon nitride with oxygen or carbon elements, and/or the like. In some implementations, deposition tool 104 of environment 100, described above in connection with FIG. 1, may be utilized to form the first ESL on the second dielectric layer, the metal gate, the first silicon nitride layer, and the metal drain.

A first inter-layer dielectric may be formed on the first ESL. The first inter-layer dielectric formed on the first ESL may include a material (e.g., silicon, silicon nitride, silicon oxide, and/or the like) that electrically insulates components of the semiconductor device. In some implementations, deposition tool 104 of environment 100, described above in connection with FIG. 1, may be utilized to form the first inter-layer dielectric on the first ESL.

A first contact may be formed in the first inter-layer dielectric and the first ESL and on the metal gate, the first silicon nitride layer, and the metal drain. The first contact may include a conductive metal, such as titanium, cobalt, tungsten, aluminum, copper, ruthenium, iridium, and/or the like. In some implementations, deposition tool 104 and etch tool 110 of environment 100, described above in connection with FIG. 1, may be utilized to form the first contact in the first inter-layer dielectric and the first ESL and on the metal gate, the first silicon nitride layer, and the metal drain.

A second ESL may be formed on the first contact and the first inter-layer dielectric. The second ESL may include a material, such as silicon nitride, silicon oxynitride, silicon nitride with oxygen or carbon elements, and/or the like. In some implementations, deposition tool 104 of environment 100, described above in connection with FIG. 1, may be utilized to form the second ESL on the first contact and the first inter-layer dielectric.

A second inter-layer dielectric may be formed on the second ESL. The second inter-layer dielectric formed on the second ESL may include a material (e.g., silicon, silicon nitride, silicon oxide, and/or the like) that electrically insulates components of the semiconductor device. In some implementations, deposition tool 104 of environment 100, described above in connection with FIG. 1, may be utilized to form the second inter-layer dielectric on the second ESL.

A second contact may be formed in the second inter-layer dielectric and the second ESL and on a portion of the first contact. The second contact may include a conductive metal, such as titanium, cobalt, tungsten, aluminum, copper, ruthenium, iridium, and/or the like. In some implementations, deposition tool 104 and etch tool 110 of environment 100, described above in connection with FIG. 1, may be utilized to form the second contact in the second inter-layer dielectric and the second ESL and on the portion of the first contact.

A third ESL may be formed on the second contact and the second inter-layer dielectric. The third ESL may include a material, such as silicon nitride, silicon oxynitride, silicon nitride with oxygen or carbon elements, and/or the like. In some implementations, deposition tool 104 of environment 100, described above in connection with FIG. 1, may be utilized to form the third ESL on the second contact and the second inter-layer dielectric.

A third inter-layer dielectric may be formed on the third ESL. The third inter-layer dielectric formed on the third ESL may include a material (e.g., silicon, silicon nitride, silicon oxide, and/or the like) that electrically insulates components of the semiconductor device. In some implementations, deposition tool 104 of environment 100, described above in connection with FIG. 1, may be utilized to form the third inter-layer dielectric on the third ESL.

A third contact may be formed in the third inter-layer dielectric and the third ESL and on a portion of the second contact. The third contact may include a conductive metal, such as titanium, cobalt, tungsten, aluminum, copper, ruthenium, iridium, and/or the like. In some implementations, deposition tool 104 and etch tool 110 of environment 100, described above in connection with FIG. 1, may be utilized to form the third contact in the third inter-layer dielectric and the third ESL and on the portion of the second contact.

As indicated above, FIGS. 2A-2I are provided merely as one or more examples. Other examples may differ from what is described with regard to FIGS. 2A-2I.

FIG. 3 is a table 300 of example process conditions for depositing a topography selective silicon nitride layer for generating spacers for a metal drain of the example semiconductor device. For example, table 300 provides cycle times for a main deposition process (e.g., 90 minutes) and a post treatment process (e.g., 30 minutes) associated with depositing the topography selective silicon nitride layer. Table 300 also provides example ranges (e.g., in standard liters per minute) of di-chlorosilane, argon, ammonia, and nitrogen utilized; an example chamber pressure range (e.g., in mTorr) utilized; an example heater power range (e.g., in Watts) utilized; an example gap range (e.g., in millimeters); example time periods associated with di-chlorosilane feed and purge, ammonia feed and purge, heater powered on, and post treatment purge; and/or the like when forming the topography selective silicon nitride layer.

As indicated above, FIG. 3 is provided merely as one or more examples. Other examples may differ from what is described with regard to FIG. 3.

Figure 4:
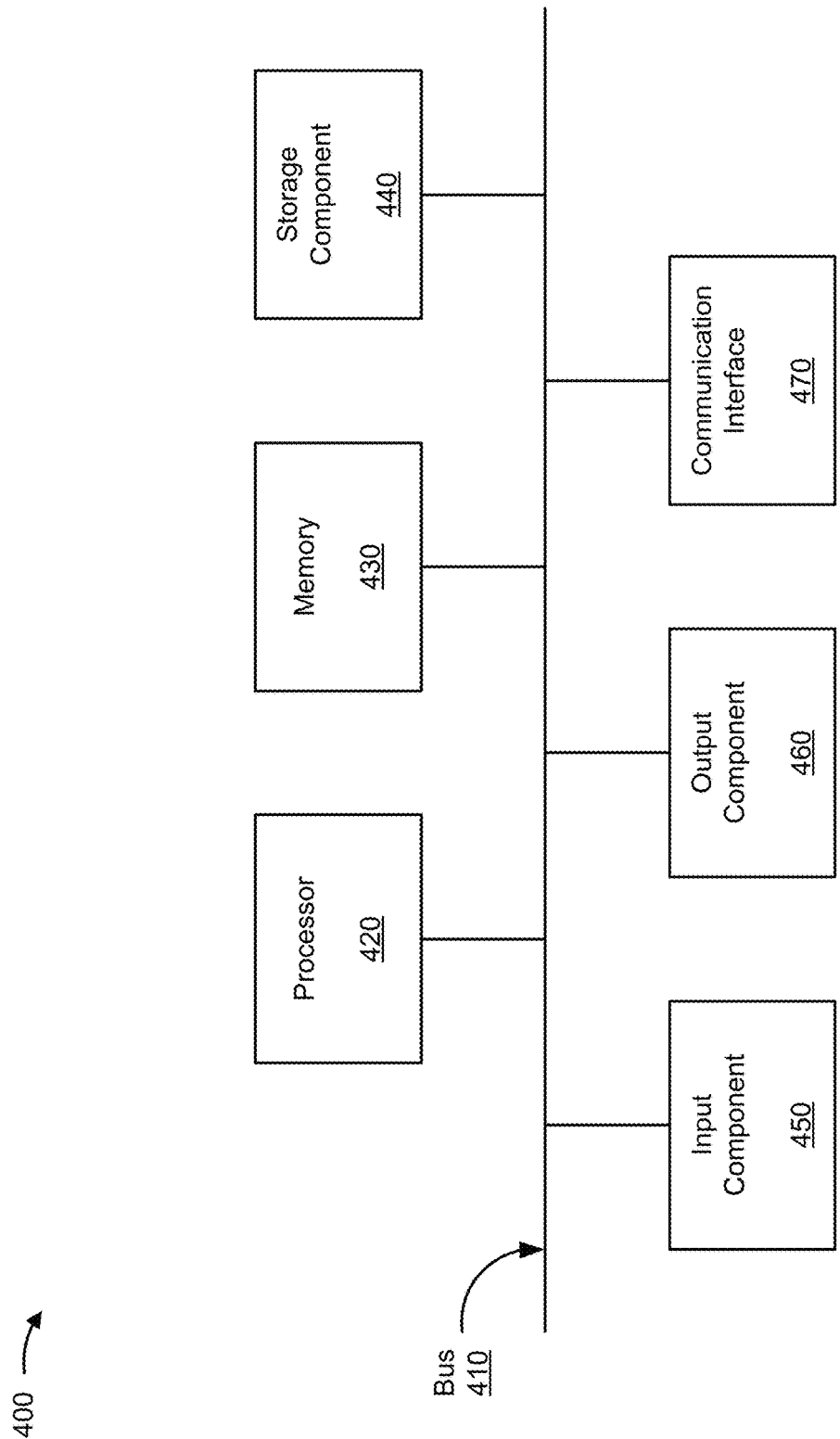
FIG. 4 is a diagram of example components of one or more tools and/or devices of FIG. 1.

FIG. 4 is a diagram of example components of a device 400. Device 400 may correspond to pre-clean tool 102, deposition tool 104, annealing tool 106, photoresist tool 108, etch tool 110, and/or wafer/die transport device 112. In some implementations, pre-clean tool 102, deposition tool 104, annealing tool 106, photoresist tool 108, etch tool 110, and/or wafer/die transport device 112 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among the components of device 400. Processor 420 is implemented in hardware, firmware, or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a sensor for sensing information (e.g., a global positioning system (GPS) component, an accelerometer, a gyroscope, and/or an actuator). Output component 460 includes a component that provides output information from device 400 (e.g., a display, a speaker, and/or one or more LEDs).

Communication interface 470 includes a transceiver-like component (e.g., a transceiver and/or a separate receiver and transmitter) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, an RF interface, a universal serial bus (USB) interface, a wireless local area interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. A computer-readable medium is defined herein as a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
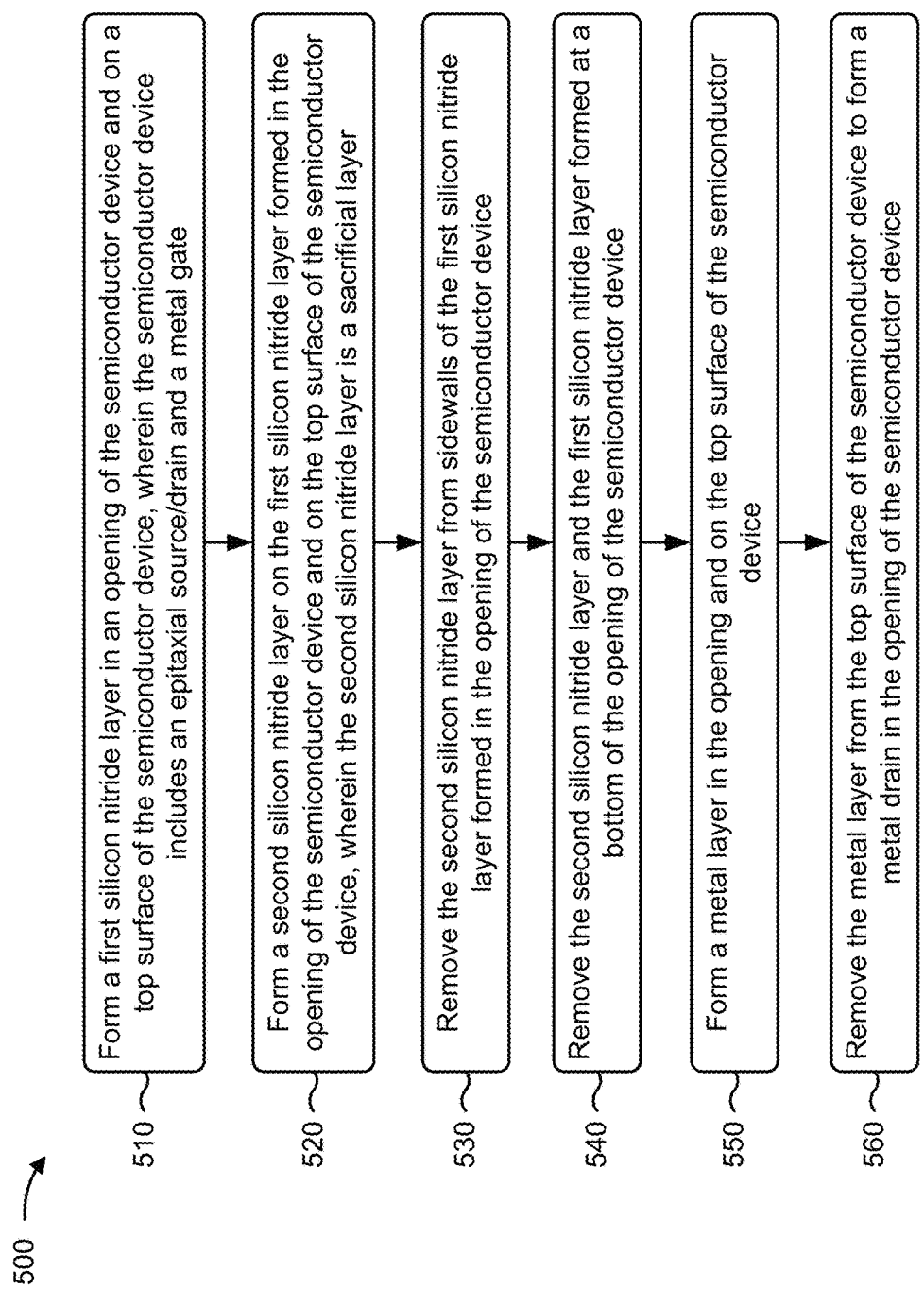
FIG. 5 is a flowchart of an example process for manufacturing a semiconductor device based on depositing a topography selective silicon nitride layer for generating spacers for a metal drain of the semiconductor device.

FIG. 5 is a flow chart of an example process 500 for manufacturing a semiconductor device based on depositing a topography selective silicon nitride layer for generating spacers for a metal drain of the semiconductor device. In some implementations, one or more process blocks of FIG. 5 may be performed by a device (e.g., one or more of the tools depicted in FIG. 1). In some implementations, one or more process blocks of FIG. 5 may be performed by another device or a group of devices separate from or including the one or more tools depicted in FIG. 1. Additionally, or alternatively, one or more process blocks of FIG. 5 may be performed by one or more components of device 400, such as processor 420, memory 430, storage component 440, input component 450, output component 460, communication interface 470, and/or the like.

As shown in FIG. 5, process 500 may include forming a first silicon nitride layer in an opening of the semiconductor device and on a top surface of the semiconductor device, wherein the semiconductor device includes an epitaxial source/drain and a metal gate (block 510). For example, the device may form a first silicon nitride layer in an opening of the semiconductor device and on a top surface of the semiconductor device, as described above. In some implementations, the semiconductor device includes an epitaxial source/drain and a metal gate.

As further shown in FIG. 5, process 500 may include forming a second silicon nitride layer on the first silicon nitride layer formed in the opening of the semiconductor device and on the top surface of the semiconductor device, wherein the second silicon nitride layer is a sacrificial layer (block 520). For example, the device may form a second silicon nitride layer on the first silicon nitride layer formed in the opening of the semiconductor device and on the top surface of the semiconductor device, as described above. In some implementations, the second silicon nitride layer is a sacrificial layer.

As further shown in FIG. 5, process 500 may include removing the second silicon nitride layer from sidewalls of the first silicon nitride layer formed in the opening of the semiconductor device (block 530). For example, the device may remove the second silicon nitride layer from sidewalls of the first silicon nitride layer formed in the opening of the semiconductor device, as described above.

As further shown in FIG. 5, process 500 may include removing the second silicon nitride layer and the first silicon nitride layer formed at a bottom of the opening of the semiconductor device (block 540). For example, the device may remove the second silicon nitride layer and the first silicon nitride layer formed at a bottom of the opening of the semiconductor device, as described above.

As further shown in FIG. 5, process 500 may include forming a metal layer in the opening and on the top surface of the semiconductor device (block 550). For example, the device may form a metal layer in the opening and on the top surface of the semiconductor device, as described above.

As further shown in FIG. 5, process 500 may include removing the metal layer from the top surface of the semiconductor device to form a metal drain in the opening of the semiconductor device (block 560). For example, the device may remove the metal layer from the top surface of the semiconductor device to form a metal drain in the opening of the semiconductor device, as described above.

Process 500 may include additional implementations, such as any single implementation or any combination of implementations described below and/or in connection with one or more other processes described elsewhere herein.

In a first implementation, forming the second silicon nitride layer includes performing a plasma enhanced atomic layer deposition operation to form the second silicon nitride layer on the first silicon nitride layer formed in the opening of the semiconductor device.

In a second implementation, alone or in combination with the first implementation, removing the second silicon layer from the sidewalls of the first silicon nitride layer includes performing an etching operation, for a particular time period and with a hydrofluoric acid diluted with water in a particular ratio, to remove the second silicon nitride layer from the sidewalls of the first silicon nitride layer formed in the opening of the semiconductor device.

In a third implementation, alone or in combination with one or more of the first and second implementations, forming the second silicon nitride layer on the first silicon nitride layer formed in the opening of the semiconductor device includes forming a first portion of the second silicon nitride layer on the sidewalls of the first silicon nitride layer formed in the opening of the semiconductor device; and forming a second portion of the second silicon nitride layer on the first silicon nitride layer formed on the bottom of the opening of the semiconductor device and on the top surface of the semiconductor device, wherein the second portion of the second silicon nitride layer is denser than the first portion of the second silicon nitride layer.

In a fourth implementation, alone or in combination with one or more of the first through third implementations, forming the second silicon nitride layer on the first silicon nitride layer formed in the opening of the semiconductor device includes performing a deposition operation, with di-chlorosilane and ammonia, with a particular heater power, at a particular temperature, and for a particular time period, to form the second silicon nitride layer on the first silicon nitride layer.

In a fifth implementation, alone or in combination with one or more of the first through fourth implementations, a thickness of the first silicon nitride layer and the second silicon nitride layer formed on sidewalls of the opening of the semiconductor device is to reduce defects in the semiconductor device and to prevent leakage from the metal drain to the metal gate.

In a sixth implementation, alone or in combination with one or more of the first through fifth implementations, process 500 includes forming a first inter-layer dielectric on the metal gate, the first silicon nitride layer, and the metal drain; forming a first contact in the first inter-layer dielectric and on the metal gate, the first silicon nitride layer, and the metal drain; forming a second inter-layer dielectric on the first inter-layer dielectric and the first contact; forming a second contact in the second inter-layer dielectric and on a portion of the first contact; forming a third inter-layer dielectric on the second inter-layer dielectric and the second contact; and forming a third contact in the third inter-layer dielectric and on a portion of the second contact.

In a seventh implementation, alone or in combination with one or more of the first through sixth implementations, process 500 includes forming a fluorine-free tungsten layer on a top surface of the metal gate.

In an eighth implementation, alone or in combination with one or more of the first through seventh implementations, the first silicon nitride layer provided on the sidewalls forms silicon nitride spacers for the metal drain, and the silicon nitride spacers isolate the metal drain from the metal gate.

In a ninth implementation, alone or in combination with one or more of the first through eighth implementations, the second silicon nitride layer is to prevent etching loss of the first silicon nitride layer from the sidewalls of the opening prior to formation of the metal drain.

In a tenth implementation, alone or in combination with one or more of the first through ninth implementations, removing the second silicon layer from the sidewalls of the first silicon nitride layer includes performing an etching operation with hydrofluoric acid that is diluted with water in a particular ratio of approximately 500:1 to prevent removal of the first silicon nitride layer from the sidewalls of the opening of the semiconductor device.

In an eleventh implementation, alone or in combination with one or more of the first through tenth implementations, forming the second silicon nitride layer includes performing a plasma enhanced atomic layer deposition operation, with a particular heater power, at a particular temperature, and for a particular time period, to form the second silicon nitride layer on the first silicon nitride layer formed in the opening of the semiconductor device.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, a method for manufacturing a semiconductor device may be based on depositing a topography selective silicon nitride layer 210 for generating spacers for a metal drain 240 of the semiconductor device. The topography selective silicon nitride layer is a sacrificial layer that ensures that the spacers (e.g., formed from silicon nitride) include a thickness that prevents and/or reduces defects in the semiconductor device, prevents and/or reduces leakage from the metal drain to the metal gate, and/or the like. For example, the topography selective silicon nitride layer decreases a likelihood of DVC defects, BVC defects, and/or the like forming in the semiconductor device.

As described in greater detail above, some implementations described herein provide a method for manufacturing a semiconductor device. The method may include forming a first silicon nitride layer in an opening of the semiconductor device and on a top surface of the semiconductor device, where the semiconductor device includes an epitaxial source/drain and a metal gate. The method may include forming a second silicon nitride layer on the first silicon nitride layer formed in the opening of the semiconductor device and on the top surface of the semiconductor device, where the second silicon nitride layer is a sacrificial layer. The method may include removing the second silicon nitride layer from sidewalls of the first silicon nitride layer formed in the opening of the semiconductor device, and removing the second silicon nitride layer and the first silicon nitride layer formed at a bottom of the opening of the semiconductor device. The method may include forming a metal layer in the opening and on the top surface of the semiconductor device, and removing the metal layer from the top surface of the semiconductor device to form a metal drain in the opening of the semiconductor device.

As described in greater detail above, some implementations described herein provide a method for manufacturing a semiconductor device. The method may include forming an epitaxial source/drain in a dielectric layer, forming a first inter-layer dielectric on a top surface of the dielectric layer, and forming a metal gate in the dielectric layer, adjacent to the epitaxial source/drain, and in the first inter-layer dielectric. The method may include forming a first silicon nitride layer on a top surface of the semiconductor device and on sidewalls of an opening provided in the first inter-layer dielectric and above the epitaxial source/drain, and forming a second silicon nitride layer on the first silicon nitride layer, where the second silicon nitride layer is a sacrificial layer. The method may include removing the second silicon nitride layer from the first silicon nitride layer formed on the sidewalls of the opening, without removing the first silicon nitride layer from the sidewalls, and removing the second silicon nitride layer and the first silicon nitride layer formed at a bottom of the opening, without removing the first silicon nitride layer from the sidewalls. The method may include removing the second silicon nitride layer and the first silicon nitride layer formed on the top surface of the semiconductor device, without removing the first silicon nitride layer from the sidewalls, and forming a metal drain in the opening and on the epitaxial source/drain, where the first silicon nitride layer provided on the sidewalls forms silicon nitride spacers for the metal drain.

As described in greater detail above, some implementations described herein provide a method for manufacturing a semiconductor device. The method may include forming a first silicon nitride layer in an opening of the semiconductor device and on a top surface of the semiconductor device, where the semiconductor device includes an epitaxial source/drain and a metal gate. The method may include performing a plasma enhanced atomic layer deposition operation to form a second silicon nitride layer on the first silicon nitride layer formed in the opening of the semiconductor device and on the top surface of the semiconductor device, where the plasma enhanced atomic layer deposition operation is performed with di-chlorosilane and ammonia. The method may include performing a first etching operation to remove the second silicon nitride layer from sidewalls of the first silicon nitride layer formed in the opening of the semiconductor device, where the first etching operation is performed with a hydrofluoric acid diluted with water in a particular ratio. The method may include performing a second etching operation to remove the second silicon nitride layer and the first silicon nitride layer formed at a bottom of the opening of the semiconductor device, where the second etching operation does not remove the first silicon nitride layer from sidewalls of the opening of the semiconductor device. The method may include depositing a metal layer in the opening of the semiconductor device to form a metal drain in the opening of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method, comprising:
    forming a first silicon nitride layer in an opening of a semiconductor device;
    forming a second silicon nitride layer on the first silicon nitride layer;
    removing the second silicon nitride layer from the first silicon nitride layer formed on sidewalls of the opening of the semiconductor device;
    removing, at a bottom of the opening of the semiconductor device, the first silicon nitride layer and the second silicon nitride layer; and
    forming a metal drain in the opening of the semiconductor device.

2. The method of claim 1, wherein the second silicon nitride layer is a sacrificial layer.

3. The method of claim 1, wherein forming the first silicon nitride layer comprises:
    forming the first silicon nitride layer in the opening of the semiconductor device and on a surface of the semiconductor device.

4. The method of claim 1, wherein the second silicon nitride layer is removed from the first silicon nitride layer formed on the sidewalls of the opening of the semiconductor device without removing the first silicon nitride layer formed on the sidewalls of the opening.

5. The method of claim 1, further comprising:
    performing, after removing the first silicon nitride layer and the second silicon nitride layer, a pre-cleaning operation in the bottom of the opening of the semiconductor device.

6. The method of claim 5, wherein the pre-cleaning operation removes native oxides.

7. A method, comprising:
    forming a first silicon nitride layer in an opening of a semiconductor device;
    forming a second silicon nitride layer on the first silicon nitride layer such that a first portion, of the second silicon nitride layer and at a bottom of the opening of the semiconductor device, is denser than a second portion, of the second silicon nitride layer and on the first silicon nitride layer formed on sidewalls of the opening;
    removing the second silicon nitride layer from the first silicon nitride layer on the sidewalls of the opening of the semiconductor device;
    removing, at a bottom of the opening of the semiconductor device, the first silicon nitride layer and the second silicon nitride layer; and
    forming a metal drain in the opening of the semiconductor device.

8. The method of claim 7, wherein the first silicon nitride layer is formed to have a first thickness on the sidewalls of the opening of the semiconductor device and a second thickness, different than the first thickness, at the bottom of the opening of the semiconductor device.

9. The method of claim 7, wherein the first silicon nitride layer is formed to have a first thickness, and the second silicon nitride layer is formed to have a second thickness different than the first thickness.

10. The method of claim 9, wherein the second silicon nitride layer has a thickness greater than the first silicon nitride layer.

11. The method of claim 7, wherein forming the second silicon nitride layer comprises:
    performing a plasma enhanced atomic layer deposition operation on the first silicon nitride layer.

12. The method of claim 11, wherein the plasma enhanced atomic layer deposition includes a deposition operation performed with di-chlorosilane and ammonia, with a particular heater power of at least one-hundred and forty-five Watts, at a particular temperature of at least approximately four-hundred and fifty degrees Celsius, and for equal to or less than approximately 1.5 seconds.

13. The method of claim 12, wherein the deposition operation is performed a plurality of times.

14. A method, comprising:
   forming a first silicon nitride layer in an opening of a semiconductor device and at a top surface of the semiconductor device, wherein an epitaxial source/drain of the semiconductor device resides in at least a portion of the opening of the semiconductor device;
   forming a second silicon nitride layer on the first silicon nitride layer;
   removing the second silicon nitride layer from sidewalls of the first silicon nitride layer;
   removing, at a bottom of the opening of the semiconductor device, the first silicon nitride layer and the second silicon nitride layer formed to expose the epitaxial source/drain in at least a portion of the opening of the semiconductor device; and
   forming a metal drain in the at least the portion of the opening of the semiconductor device.

15. The method of claim 14, wherein forming the first silicon nitride layer in the opening of the semiconductor device comprises:
   forming the first silicon nitride layer over one or more dielectric layers of the semiconductor device provided in the opening of the semiconductor device.

16. The method of claim 14, wherein forming the first silicon nitride layer at the top surface of the semiconductor device comprises:
   forming the first silicon nitride layer over a dielectric layer of the semiconductor device and a sacrificial oxide layer of the semiconductor device.

17. The method of claim 14, wherein the second silicon nitride layer is removed from the sidewalls of the opening of the semiconductor device using hydrofluoric acid diluted with water in a particular ratio.

18. The method of claim 14, wherein forming the metal drain comprises:
   depositing a metal layer in the opening of the semiconductor device and the top surface of the semiconductor device; and
   removing, at the top surface of the semiconductor device, the metal layer to form the metal drain in the opening of the semiconductor device.

19. The method of claim 14, wherein the semiconductor device further comprises a metal gate, and the method further comprising:
   forming a first inter-layer dielectric on the metal gate, the first silicon nitride layer, and the metal drain; and
   forming a first contact in the first inter-layer dielectric and on the metal gate, the first silicon nitride layer, and the metal drain.

20. The method of claim 19, further comprising:
   forming a second inter-layer dielectric on the first inter-layer dielectric and the first contact; and
   forming a second contact in the second inter-layer dielectric and on a portion of the first contact.

* * * * *